METHOD OF FABRICATING SEMICONDUCTOR DEVICES

Filed Oct. 23, 1965 Sheet 1 of 4

INVENTOR.
MATTHEW M. BELL
BY
Glenn H. Bruestle
Attorney

INVENTOR.
MATTHEW M. BELL
BY
[signature]
Attorney

INVENTOR.
MATTHEW M. BELL
BY
Attorney

INVENTOR.
MATTHEW M. BELL
BY
Glenn H. Bruestle
Attorney

United States Patent Office 3,429,030
Patented Feb. 25, 1969

3,429,030
METHOD OF FABRICATING SEMICONDUCTOR DEVICES

Matthew M. Bell, Westfield, N.J., assignor to Radio Corporation of America, a corporation of Delaware Filed Oct. 23, 1965, Ser. No. 503,290
U.S. Cl. 29—580 4 Claims
Int. Cl. H01l *5/02, 1/10;* B23p *19/00*

ABSTRACT OF THE DISCLOSURE

A method of fabricating semiconductor devices comprising providing a workpiece carrier having a pair of straps and a plurality of spaced rod groups extending between and secured to said straps, forming a flat on one rod of each of said rod groups, bonding a semiconductor pellet to said flat of each rod group, bonding an electrical connector from said pellet to another rod of each rod group, encapsulating said flat, said connector, and portions of said another rod to which said connector is bonded of each rod group, and severing each encapsulated rod group from said straps.

This invention relates to the manufacture of electrical devices, and particularly to the manufacture of semiconductive devices such as transistors.

An object of this invention is to provide improved and novel methods for fabricating electrical devices, and particularly transistors.

For achieving this object, in one illustrative embodiment, a workpiece carrier is provided comprising a pair of parallel straps and spaced groups of conductors extending transversely between and secured to the straps. At least one conductor of each group of conductors (which constitutes a transistor workpiece) is provided with a flat portion thereon.

A semiconductor pellet is bonded to one flat of each workpiece group. One or more connections, e.g., by fine wires, are made from different portions of the pellet to other conductors of each group. Each pellet and its associated connector and conductors are then encapsulated and the conductors thereof severed adjacent to the carrier straps to provide the finished transistor.

Figure 1:
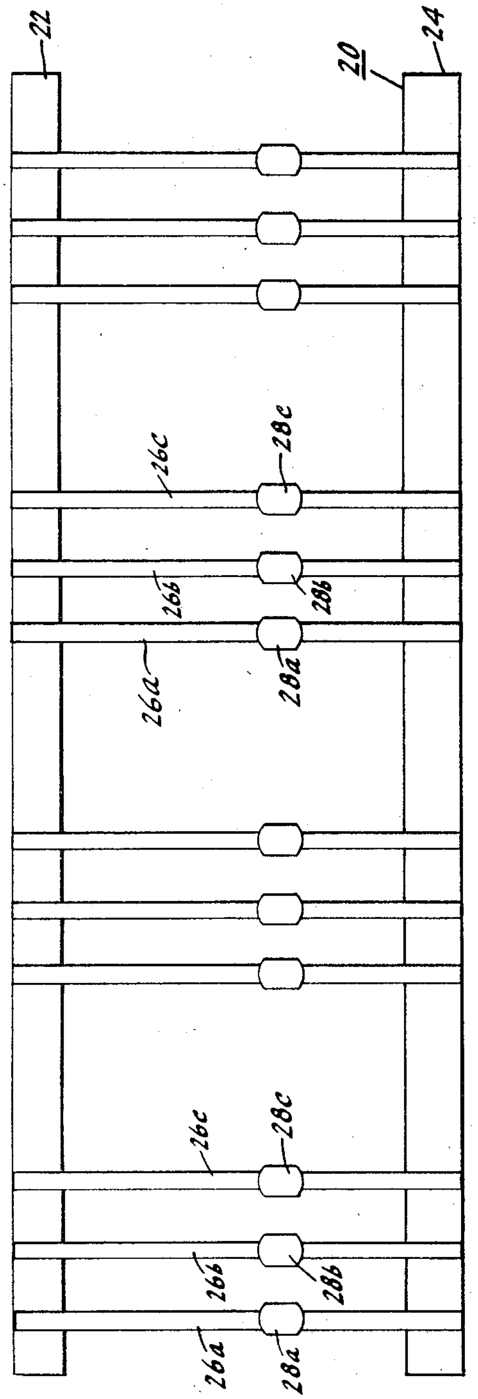
FIG. 1 is a plan view of a transistor workpiece carrier.

With reference to FIG. 1, a carrier 20 is shown comprising a pair of parallel straps 22 and 24, and a plurality of conductors or rods 26*a*, 16*b*, and 26*c* extending transversely between and secured to the straps. In this embodiment, the rods are arranged in spaced groups of three, each group of rods 26*a*, 26*b*, 26*c* comprising a workpiece to be fabricated into a transistor. Each rod 26*a*, 26*b*, 26*c* is provided with an enlarged portion, platform, or flat 28*a*, 28*b*, 28*c*, respectively, the flats being disposed along a line parallel to the straps 22 and 24. The purpose of the flats is to facilitate subsequent fabricating operations and to prevent rotation of the rods when the rods function as the terminal leads of a completed transistor, as described hereinafter.

The straps 22 and 24 may be made of any weldable material, such as nickel plated iron, and the rods may be made of a material normally used for transistor leads, such as a 48% iron, 52% nickel alloy known as "52 alloy." Although shown with rectangular and circular cross-sections (FIG. 2), the straps and rods, respectively, may have other cross-sections as desired.

Figure 2:
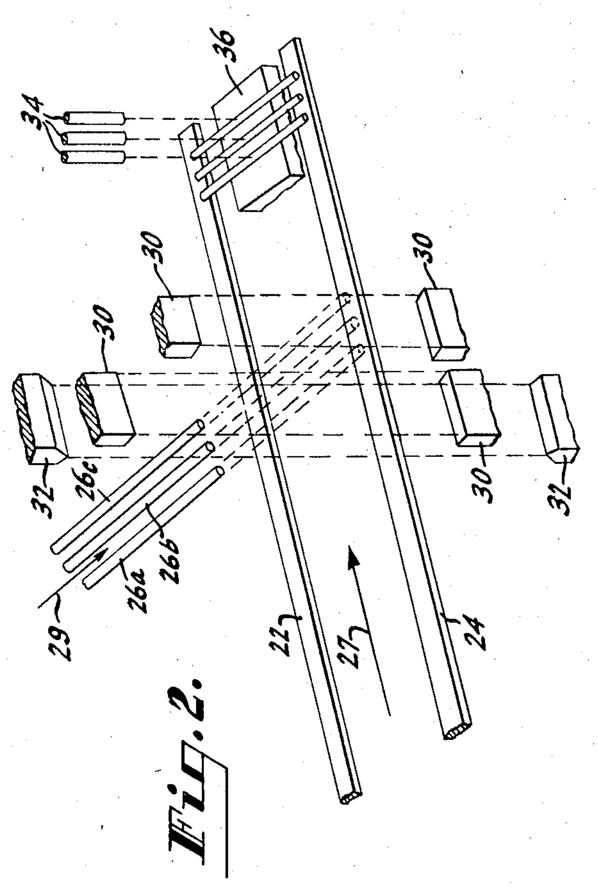
FIG. 2 is a schematic view of apparatus for making the carrier shown in FIG. 1.

The carrier 20 may be fabricated as follows. With reference to FIG. 2, a pair of straps 22 and 24 are advanced in a first direction indicated by the arrow 27. Three rods 26*a*, 26*b*, 26*c* are fed in a second direction indicated by the arrow 29 transverse to, and preferably perpendicular to the first direction, until the rods cross the two straps 22 and 24. Oppositely disposed welding electrodes 30 are moved into engagement with the rods 26*a*, 26*b*, 26*c* and the straps 22 and 24 at the crossover points therebetween and weld the rods to the straps. Thereafter, oppositely disposed cutting blades 32 sever the rods 26*a*, 26*b*, and 26*c* adjacent to the strap 22, thereby providing a first rod group. The straps 22 and 24 and the rods welded thereto are then advanced a distance equal to the desired distance between the rod groups, and the rods 26*a*, 26*b*, 26*c* are again advanced to cross the straps 22 and 24. The welding and cutting steps are repeated, thereby providing a second rod group spaced from the first rod group. The process is continued as often as desired, thereby providing a carrier containing a plurality of rod groups.

After a rod group is formed and advanced, three flat forming tools 34 are moved downwardly to deform a middle portion of the rods 26*a*, 26*b*, and 26*c* into the flats 28*a*, 28*b*, and 28*c*, respectively, against a backup tool 36.

The provision of apparatus of a type suitable for performing the aforementioned carrier fabricating steps is well within the skill of workers skilled in the art. Hence, for the sake of brevity, details of such apparatus are not presented herein.

Having prepared the workpiece carrier, a number of operations are performed on each workpiece rod group to fabricate a transistor therefrom. Preferably, each operation is performed on each rod group of the carrier before a further operation is performed.

Figure 3:
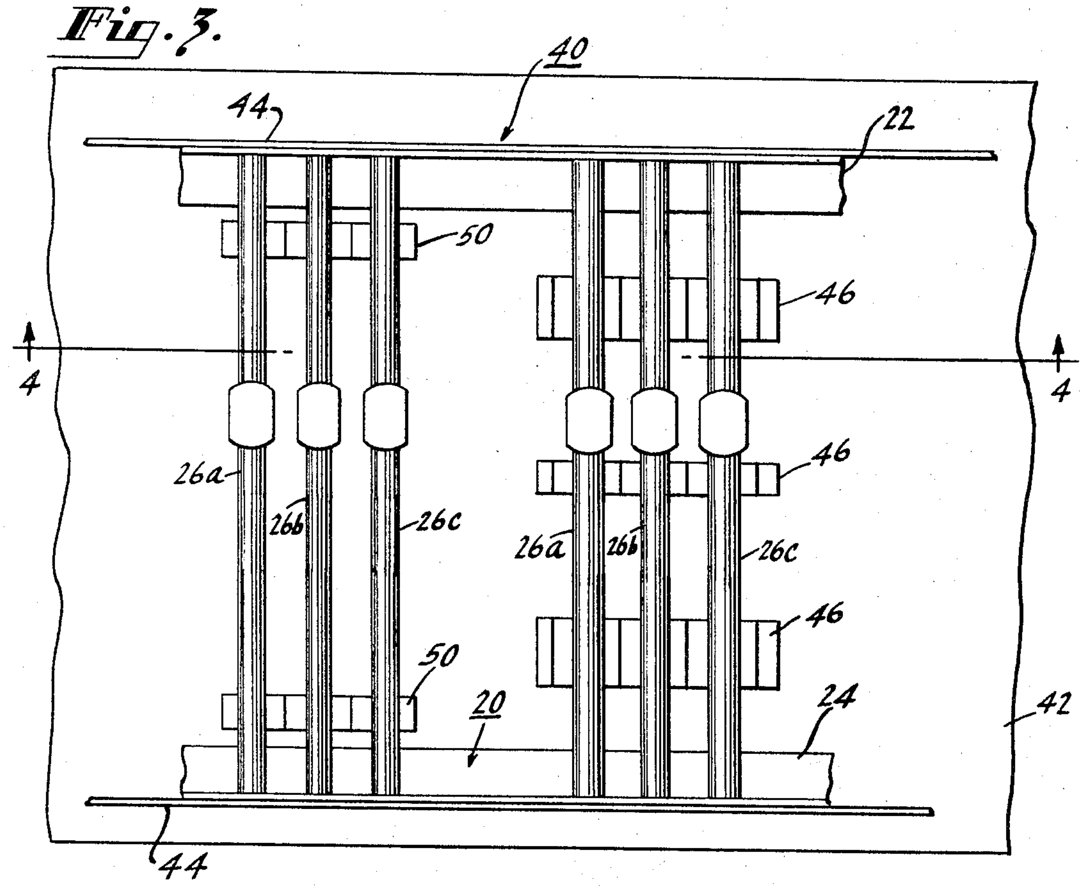
FIG. 3 is a plan view of a device for indexing and locating a carrier, a carrier being shown in the device.
Figure 4:
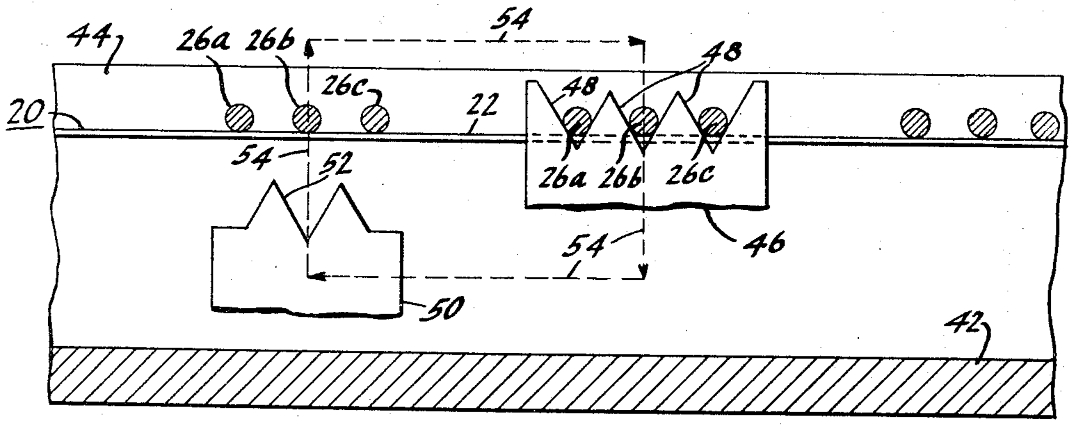
FIG. 4 is a section along line 4—4 of FIG. 3.

With reference to FIGS. 3 and 4, a carrier indexing and workpiece locating device 40 which may be used in each workpiece operating station is shown. The device 40 comprises a base plate 42 on which is mounted a pair of parallel guide members 44 between which the carrier 20 is advanced. Mounted on base plate 42 between the guides 44 are three rod group positioning members 46 having three V-shaped slots 48 for receipt of the rods 26*a*, 26*b*, and 26*c* of each rod group. A pair of indexing members 50 each having a V-slot 52 is also provided. Means, not shown, are utilized to provide the indexing members with a four direction, sequential movement, as shown by the dotted lines 54 in FIG. 4. In a first movement, the indexing members 50 are moved upwardly to engage the middle rod 26*b* of a rod group, advance the rod group towards the positioning members 46 in a second movement, lower the rod group into engagement with the slots 48 of the positioning members 46 in a third movement, and return in a fourth movement to the original position to reposition the members 50 for the start of a new indexing cycle. The tapered walls of the slots 48 of the positioning members guide the rod group into correct position with respect to the operation performing means of the operating station in which the indexing and locating device 40 is used.

Figure 5:
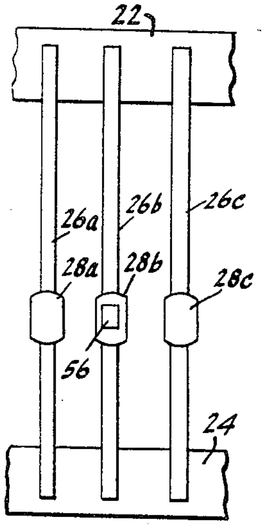
FIGS. 5–8 are plan views of a portion of a workpiece carrier showing successive steps in the fabrication of a transistor.

Each workpiece is fabricated into a transistor as follows:

In a first operation (FIG. 5), a brazing material plate 56, of a material such as gold, is secured to the flat **28*b* of the middle rod 26*b* of each rod group. Means for bonding such brazing material plates to portions of leads, such as the flats 28*b*** are known, hence are neither shown nor described herein.

Figure 6:
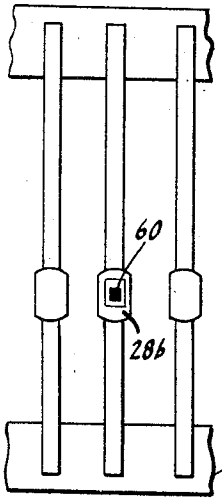

In a next operation (FIG. 6), a semiconductor pellet 60 is deposited on the brazing material plate located on the flats **28*b* of each rod group, and the flat 28*b* is heated to braze the pellet 60 to the flat. Means for preparing pellets and transferring them are well known and are not described herein. An alternate arrangement is to use gold plated rods 26*b*. In such case, a brazing material plate is not required and the pellet 60 is brazed to the flat 28*b*** using the gold plating as a brazing material.

Figure 7:
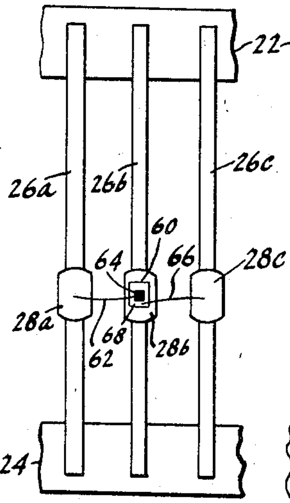

In a next operation (FIG. 7), fine wires are bonded between different points on the pellet 60 and the flats **28*a* and 28*c* of the rods 26*a* and 26*c* of each rod group. Thus, for example, as shown in FIG. 7, a wire 62 is bonded between an inner portion 64 of the pellet 60 and the flat 28*a* on rod 26*a*, and a wire 66 is bonded between an outer portion 68 of the pellet 60 and the flat 28*c* on rod 26*c*. The bottom of the pellet 60 is bonded directly to the flat 28*b* on rod 26*b*. If the inner and outer portions 64 and 68, respectively, are N-type doped, and an intermediate portion including the bottom of pellet 60 is P-type doped, for example, the resulting transistor is an N–P–N type transistor wherein rod 26*b* is electrically connected to the base of the transistor, rod 26*a* is electrically connected to the emitter of the transistor, and rod 26*c*** is electrically connected to the collector of the transistor.

Means for bonding wires between portions of pellets and leads or rods are well known and are not described herein.

Figure 8:
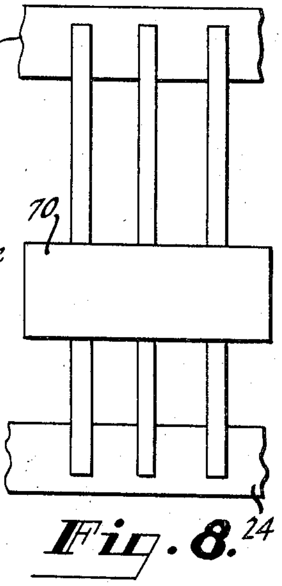

In a subsequent operation, a solid body or casing 70, as shown in FIG. 8, is molded around the central portion of each rod group thereby encapsulating the flats **26*a*, 26*b*, and 26*c*, the pellet 60, and the connecting wires 62 and 66**. The molding material may comprise a known thermosetting plastic material such as Dow Corning 305 silicon molding compound. Means for molding such material about objects are well known and are not described herein.

Figure 9:
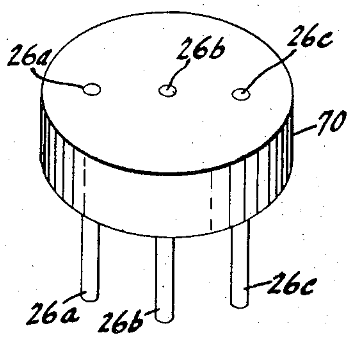
FIG. 9 is a perspective view of a transistor made according to the process illustrated in FIGS. 5–8.
Figure 15:
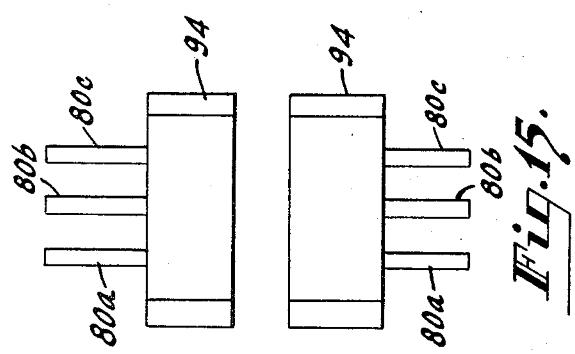
Figure 14:
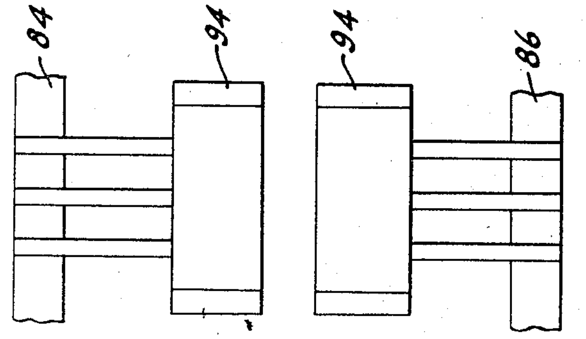
Figure 13:
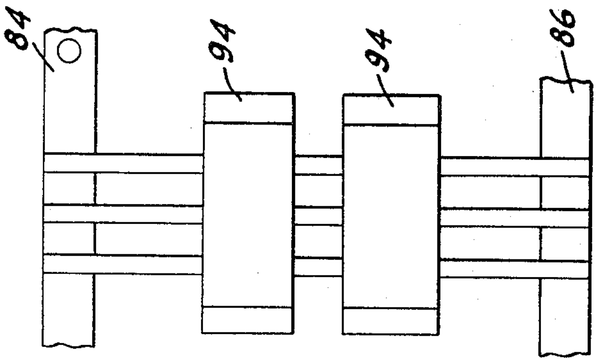

In a subsequent operation, the rods of each group are severed closely adjacent to the strap 22 on one side of the casing 70 and closely adjacent to the casing on its other side. This provides the finished transistor, as shown in FIG. 9. The extending rods **26*a*, 26*b*, and 26*c*** serve as the terminals of the transistor.

Figures 10, 11, 12:
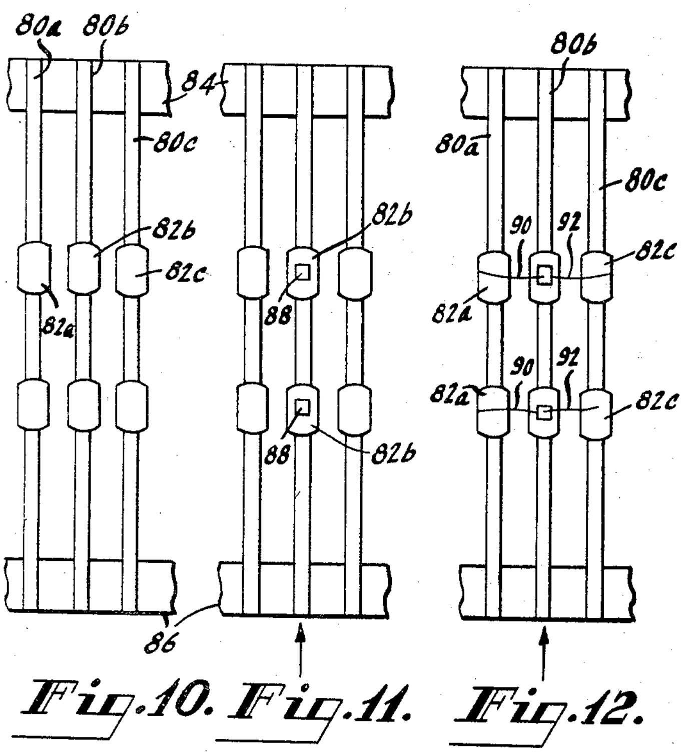
FIGS. 10–15 are views similar to FIGS. 5–8 showing a modification of the carrier, and the successive steps used in the fabrication of transistors therefrom.

In FIGS. 10 through 15 is illustrated a method for providing two transistors from each rod group workpiece. As shown in FIG. 10, each rod **80*a*, 80*b*, and 80*c* is provided with a pair of flats 82*a*, 82*b*, and 82*c*, respectively, the flats of each rod being disposed along two lines parallel to the straps 84 and 86. The remaining steps are basically similar to the fabricating steps described in connection with FIGS. 5 through 8. That is, a pellet 88 (FIG. 11) is provided on each flat 82*b* of the middle rod 80*b* of each rod group; connecting wires 90 and 92 (FIG. 12) are bonded between the pellet and the flats 82*a* and 82*c* of the rods 80*a* and 80*c* of each workpiece group; a body 94 (FIG. 13) is molded around the flat portions of the rods, the portions of the rods extending between the molded casings 94 are severed (FIG. 14), and the rods extending between the molded bodies 94 and the straps 84 and 86** are severed closely adjacent to the straps to provide the finished transistors.

Although each workpiece rod group has been shown having three rods in the described embodiments, it is clear that any number of rods may be used to provide transistors or other electrical devices having any number of leads or terminals as required.

What is claimed is:

1. A method of assembling a transistor comprising:
advancing a pair of straps in a first direction,
advancing three rods of circular cross setcion in a second direction transverse to said first direction and crossing said straps,
bonding said rods and straps at the crossover points therebetween to form a first workpiece,
cutting said rods adjacent one of said straps,
repeating said aforementioned steps to provide a plurality of spaced workpieces,
forming a flat on at least one rod of each workpiece,
bonding a semiconductor pellet to the flat of each workpiece,
bonding wires from said pellet to the other rods of each workpiece,
encapsulating said flat, said wires, and portions of said other rods to which said wires are bonded of each workpiece, and
severing each encapsulated workpiece from said straps.

2. The method as in claim 1 including the steps of forming a flat on each of said rods of each workpiece, and encapsulating said flats, said wires, and portions of said other rods to which said wires are bonded of each workpiece in a solid, molded enclosure.

3. A method of fabricating transistors comprising:
providing a transistor workpiece carrier comprising a pair of parallel straps and a plurality of rods of circular cross section extending transversely between and secured to said straps, said rods being disposed in a plurality of spaced rod groups,
forming a flat on each of said rods,
bonding a semiconductor pellet to a flat of each rod group,
bonding wires from said pellet to the flats of the other rods of each rod group,
encapsulating the flats and the wires extending therebetween of each rod group in a solid, molded enclosure, and
severing each encapsulating rod group from said straps.

4. A method of fabricating transistors comprising:
providing a transistor workpiece carrier comprising a pair of parallel straps and a plurality of rod groups each comprising three rods of circular cross section extending transversely between and secured to said straps,
forming a pair of flats on each of said rods, one of said flats of each of said rods lying on a first line parallel to said straps and the other flat on each of said rods lying on a second line parallel to said straps,
bonding a semiconductor pellet to each flat of the middle rod of each group of rods,
bonding a wire from each pellet to the in-line flats of the other rods of each rod group,
encapsulating each set of three in-line flats, pellet, and wires of each group of rods in a solid, molded casing thereby providing two casing for each rod group,
severing the portions of the rods extending between the casings of each rod group, and
severing said rods adjacent to said straps.

References Cited

UNITED STATES PATENTS

| | | | |
|---|---|---|---|
| 2,845,693 | 8/1958 | Shetterly et al. | 29—628 |
| 3,145,448 | 8/1964 | Cotton | 29—155.5 |
| 3,186,065 | 6/1965 | Hunt | 29—591 |
| 3,226,803 | 1/1966 | Samuels | 29—155.5 |
| 3,281,628 | 10/1966 | Bauer et al. | 29—588 |

JOHN F. CAMPBELL, *Primary Examiner.*

R. B. LAZARUS, *Assistant Examiner.*

U.S. Cl. X.R.

29—430, 588, 589